(12) United States Patent
Hwang et al.

(10) Patent No.: US 10,714,981 B2
(45) Date of Patent: Jul. 14, 2020

(54) APPARATUS FOR PROTECTING WIRELESS COMMUNICATION DEVICE AND WIRELESS COMMUNICATION DEVICE COMPRISING SAME

(71) Applicant: MAPS, INC., Yongin-si (KR)

(72) Inventors: Jong Tae Hwang, Seoul (KR); Sung Min Park, Seoul (KR); Min Jung Ko, Seoul (KR); Dong Su Lee, Dongducheon-si (KR); Jong Hoon Lee, Seongnam-si (KR); Ki-Woong Jin, Anyang-si (KR); Hyun Ick Shin, Seoul (KR); Joon Rhee, Seoul (KR)

(73) Assignee: MAPS, INC., Yongin-si (KR)

( * ) Notice: Subject to any disclaimer, the term of this patent is extended or adjusted under 35 U.S.C. 154(b) by 188 days.

(21) Appl. No.: 16/072,919

(22) PCT Filed: Dec. 2, 2016

(86) PCT No.: PCT/KR2016/014125
§ 371 (c)(1),
(2) Date: Jul. 26, 2018

(87) PCT Pub. No.: WO2017/138691
PCT Pub. Date: Aug. 17, 2017

(65) Prior Publication Data
US 2019/0036381 A1     Jan. 31, 2019

(30) Foreign Application Priority Data

Feb. 12, 2016  (KR) ........................ 10-2016-0016306
Apr. 15, 2016  (KR) ........................ 10-2016-0046318

(51) Int. Cl.
*H02J 50/12*     (2016.01)
*H02J 7/00*      (2006.01)
(Continued)

(52) U.S. Cl.
CPC ............... *H02J 50/12* (2016.02); *H02H 9/04* (2013.01); *H02J 7/0029* (2013.01); *H02J 7/02* (2013.01);
(Continued)

(58) Field of Classification Search
CPC .. H02J 50/12; H02J 7/0029; H02J 7/02; H02J 7/00; H02H 9/04; H04B 5/00; G01R 19/165; H03F 1/56
See application file for complete search history.

(56) References Cited

U.S. PATENT DOCUMENTS 9,160,196 B2    10/2015  Endo
2013/0157565 A1  6/2013  Clement et al.
(Continued)

FOREIGN PATENT DOCUMENTS

JP      2014-217193 A    11/2014
KR   10-2014-0017462 A    2/2014
KR   10-2015-0134307 A   12/2015

OTHER PUBLICATIONS

International Search Report dated Feb. 24, 2017 in corresponding International Patent Application No. PCT/KR2016/014125 (2 pages in English and 2 pages in Korean).

*Primary Examiner* — Robert L Deberadinis
(74) *Attorney, Agent, or Firm* — NSIP Law (57) ABSTRACT

Disclosed are an apparatus for protecting a wireless communication device and a wireless communication device comprising the same. The protection apparatus according to one embodiment comprises: a determination unit for detecting a power supply voltage of a wireless communication device for wirelessly transmitting and receiving a signal by generating a magnetic field or reacting therewith, and determining a wireless charging state from the outside when an increase in the power supply voltage, which is greater than or equal to a preset threshold, is detected; and a protection (Continued)

unit for protecting the wireless communication device from a power signal for wireless charging when the wireless charging condition is determined through the determination unit.

14 Claims, 10 Drawing Sheets

(51) Int. Cl.
| | |
|---|---|
| *H02J 7/02* | (2016.01) |
| *H02H 9/04* | (2006.01) |
| *H04B 5/00* | (2006.01) |
| *H03F 1/56* | (2006.01) |
| *G01R 19/165* | (2006.01) |

(52) U.S. Cl.
CPC ............ *H04B 5/00* (2013.01); *G01R 19/165* (2013.01); *H03F 1/56* (2013.01)

(56) References Cited

U.S. PATENT DOCUMENTS

| | | |
|---|---|---|
| 2014/0035521 A1 | 2/2014 | Endo |
| 2015/0003181 A1 | 1/2015 | Droege et al. |
| 2015/0357829 A1 | 12/2015 | Makita |
| 2016/0013683 A1 | 1/2016 | Endo |
| 2016/0020600 A1 | 1/2016 | Mori et al. |

APPARATUS FOR PROTECTING WIRELESS COMMUNICATION DEVICE AND WIRELESS COMMUNICATION DEVICE COMPRISING SAME

CROSS REFERENCE TO RELATED APPLICATIONS

This application is a U.S. National Stage Application of International Application No. PCT/KR2016/014125, filed on Dec. 2, 2016, which claims the benefit under 35 USC 119 (a) and 365 (b) of Korean Patent Application No. 10-2016-0016306, filed on Feb. 12, 2016, and Korean Patent Application No. 10-2016-0046318, filed on Apr. 15, 2016 in the Korean Intellectual Property Office.

TECHNICAL FIELD

The present invention relates to a technology for wireless transmission/reception.

BACKGROUND ART

A short-range communication module that performs communication using a magnetic field formed in a frequency band of several to several tens of MHz is used in a radio frequency identification (hereinafter, referred to as RFID) module, a near field communication (hereinafter, referred to as NFC) module, and the like. In particular, various applications using an NFC method are used in portable terminals, such as mobile phones, and are gaining popularity as auxiliary payment devices.

As inductive wireless charging method, a Qi method of Wireless Power Consortium (WPC) and a Power Matters Alliance (PMA) method perform wireless charging using a low-frequency band in a range of 100 kHz. Meanwhile, NFC performs communication using a 13.56 MHz band, that is, industrial-scientific-medical frequency band (hereinafter, referred to as an ISM band), which is very different from the frequency band for the wireless charging method, and thus there is no problem due to little interference between the inductive wireless charging method and NFC.

In contrast, Alliance for Wireless Power (hereinafter, referred to as A4WP) using magnetic resonance uses a 6.78 MHz ISM band, which is very close to the 13.56 MHz ISM band of NFC, and thus power supplied from an A4WP power transmitting unit (hereinafter, referred to as a PTU) may be unintentionally supplied to an NFC module through an NFC antenna. Generally, an NFC module transmits and receives low power, and when a great amount of power is supplied thereto from the A4WP PTU, the NFC module may receive excessive power, and thus the NFC module may be broken.

Technical Problem

The present invention is directed to providing an apparatus for protecting a wireless communication device from wireless charging, and a wireless communication device having the same.

Technical Solution

One aspect of the present invention provides an apparatus for protecting a wireless communication device, the apparatus including: a determination unit configured to sense a power voltage of a wireless communication device that transmits and receives a signal in a wireless manner by generating or reacting to a magnetic field, and configured to externally confirm a wireless charging state in response to sensing the power voltage rising to a preset threshold voltage or higher; and a protection unit configured to protect the wireless communication device from a power signal for wireless charging when the wireless charging state is confirmed by the determination unit.

The determination unit may include an excessive voltage meter configured to measure a power voltage of a main body of the wireless communication device, determine the wireless charging state when the power voltage rises, and transmit a high-level control signal for controlling the protection unit to the protection unit.

The determination unit may include a frequency sensor configured to sense a frequency of an input signal of a rectifier inside a main body of the wireless communication device, confirm a wireless charging state when the sensed frequency is a resonance frequency for wireless charging, and apply a high-level control signal for controlling the protection unit to the protection unit.

The determination unit may include: an excessive voltage meter configured to measure a power voltage of a main body of the wireless communication device, determine a wireless charging state when the power voltage rises and output a high-level control signal; a frequency sensor configured to sense a frequency of an input signal of a rectifier inside the main body of the wireless communication device, confirm a wireless charging state when the sensed frequency is a resonance frequency for wireless charging, and output a high-level control signal; and an AND circuit configured to receive the high-level control signals of the excessive voltage meter and the frequency sensor, perform a logic product on the received high-level control signals, and transmit a control signal for controlling the protection unit to the protection unit.

The protection unit may include a switching element configured to receive a control signal from the determination unit, and with the switching element being turned on by the control signal of the determination unit in response to the power voltage rising, may allow an antenna current to flow through the switching element such that the wireless communication device is protected from wireless power.

The protection unit may include a switching element configured to receive a control signal from the determination unit, wherein by repeating an operation in which the switching element is turned on by the control signal to prevent an antenna current from being applied to the power voltage so as to reduce the power voltage, the switching element may be turned off, and as the switch element is turned off, the power voltage may rise again to protect the wireless communication device.

The protection unit may include: a first switching element having a first output to which a ground voltage is applied, a second output connected to a first antenna node, and an input to which a control signal generated from an excessive voltage meter is transmitted such that the first switching element is turned on or off by the control signal; and a second switching element having a third output to which a ground voltage is applied, a fourth output connected to a second antenna node, and an input to which the control signal generated from the excessive voltage meter is transmitted such that the second switching element is turned on/off by the control signal.

The protection unit may include: a first switching element having a first output to which a ground voltage is applied, a second output connected to a first impedance element, and an input to which a control signal generated from an excessive voltage meter is transmitted such that the first switching element is turned on or off by the control signal; a second switching element having a third output to which a ground voltage is applied, a fourth output connected to a second impedance element, and an input to which the control signal generated from the excessive voltage meter is transmitted such that the second switching element is turned on or off by the control signal; the first impedance element formed between a first antenna node and the first switching element, and by having a current path formed due to the first switching element being turned on, allowing a resonance frequency of a resonance circuit to be shifted; and the second impedance element formed between a second antenna node and the second switching element, and by having a current path formed due to the second switching element being turned on, allowing a resonance frequency of the resonance circuit to be shifted. Each of the first and second impedance elements may be one of a resistor, an inductor, and a capacitor or a combination thereof.

The wireless communication device may be a near field communication (NFC) device. The wireless communication device may be a magnetic secure transmission (MST) device.

Another aspect of the present invention provides a wireless communication device including: a resonator including an antenna or an inductive element that generates or reacts to a magnetic field; a main body including a rectifier configured to receive an output of a resonator and rectify the received output; and a protection apparatus configured to sense a power voltage of the main body, externally confirm a wireless charging state when the power voltage rises to a preset threshold voltage or higher, and protect the wireless communication device from a power signal for wireless charging.

Another aspect of the present invention provides a wireless communication device including: a resonator including an antenna or an inductive element that generates or reacts to a magnetic field; and a main body including a rectifier configured to receive an output of the resonator and rectify the received output, and a protection apparatus configured to sense a power voltage of the main body, externally confirm a wireless charging state when the power voltage rises to a preset threshold voltage or higher, and protect the wireless communication device from a power signal for wireless charging.

Another aspect of the present invention provides a portable terminal including: a power receiver antenna; a wireless communication antenna; a power receiving unit configured to receive a wireless power signal from a power transmitting unit through magnetic resonance of the power receiver antenna; a wireless communication main body configured to perform wireless communication using a magnetic field of the wireless communication antenna; and a protection apparatus configured to sense a power voltage of the wireless communication main body, determine that the power receiving unit is in a wireless charging state in response to sensing the power voltage rising to a preset threshold voltage or higher, and protect the wireless communication main body from a power signal for wireless charging.

Advantageous Effects

As is apparent from the disclosure, a wireless communication device can be protected from wireless charging. Particularly, a wireless communication device using an antenna or an inductive element together with an NFC device or magnetic secure transmission (MST) device can be protected from an external magnetic field.

A wireless communication device is protected by blocking a power signal from being supplied to the wireless communication device during wireless charging so that when a power signal is supplied from a power transmitting unit, an inductive-scheme wireless communication device is prevented from being unintentionally supplied with excessive power and thus being broken.

MODES OF THE INVENTION

Hereinafter, advantages, features, and ways to achieve them will become readily apparent with reference to descriptions of the following detailed embodiments when considered in conjunction with the accompanying drawings. However, the scope of the present invention is not limited to such embodiments, and the present invention may be realized in various forms. The embodiments to be described below are only embodiments provided to complete the disclosure of the present invention and assist those skilled in the art in completely understanding the scope of the present invention. The present invention is defined only by the scope of the appended claims. In the descriptions, the same reference numerals are used to designate the same elements.

In the description of the present invention, detailed descriptions of related known functions or constructions will be omitted to avoid obscuring the subject matter of the present invention. In addition, terms which are used below are defined in consideration of functions in the present invention and may vary with an intention of a user and an operator or a custom. Accordingly, the definition of the terms should be determined on the basis of the overall content of the specification.

Hereinafter, embodiments of the present invention will be described in detail with reference to the accompanying drawings. However, the present invention may be realized in various forms, and the scope of the present invention is not limited to such embodiments. The embodiments of the present invention are provided to aid those skilled in the art in the explanation and the understanding of the present invention.

Figure 1:
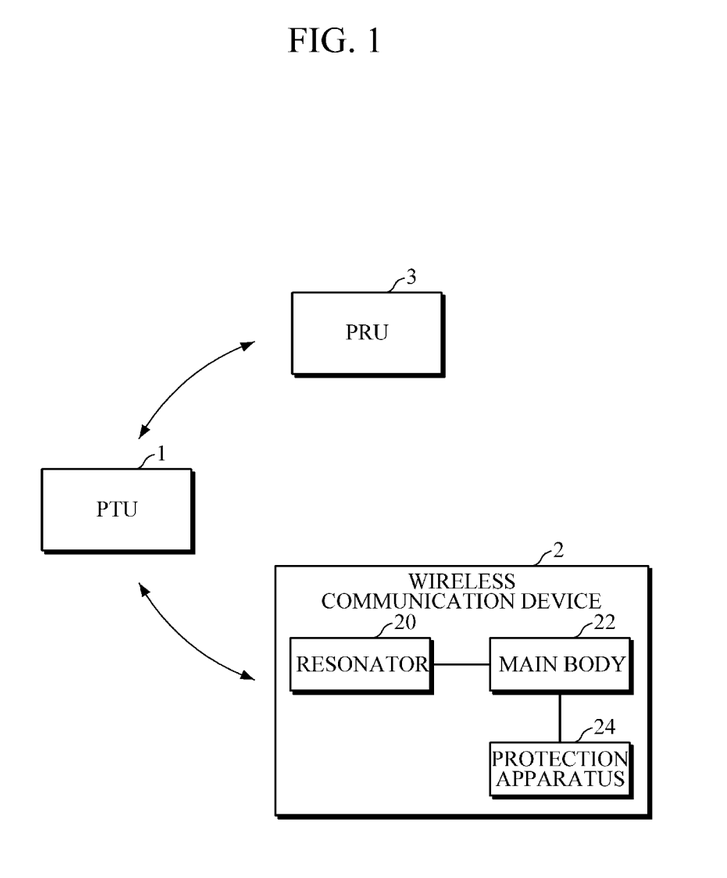
FIGS. 1 and 2 are block diagrams illustrating a relation between a power transmitting unit (PTU) and a power receiving unit (PRU) according to an embodiment of the present invention.
Figure 2:
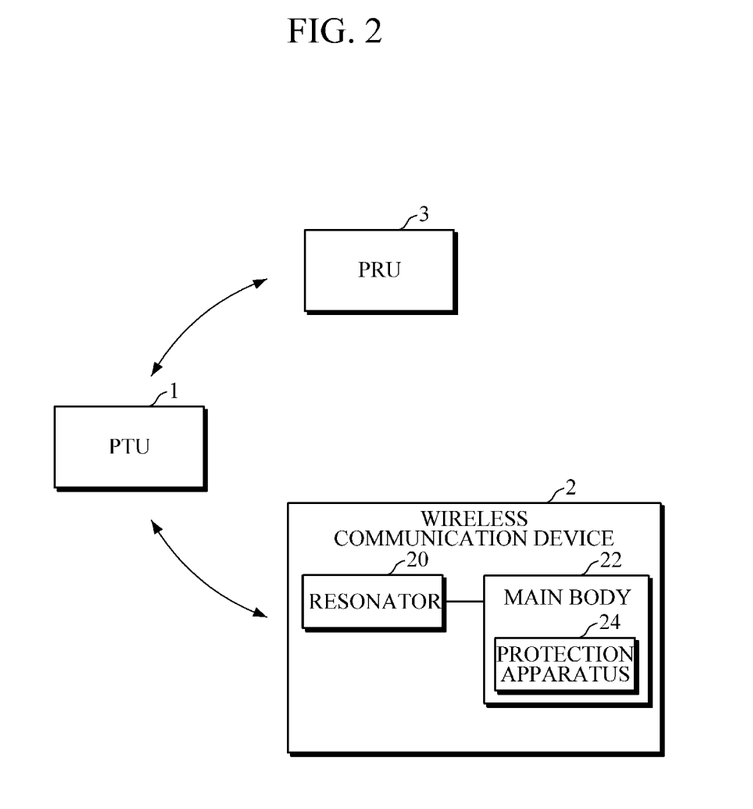

FIGS. 1 and 2 are block diagrams illustrating a relation between a power transmitting unit (PTU) and a power receiving unit (PRU) according to an embodiment of the present invention, Referring to FIGS. 1 and 2, a PTU 1 supplies a power signal to a PRU 3 in a wireless manner to perform wireless charging. In this case, a protection apparatus 24 protects a wireless communication device 2 from the power signal for wireless charging. The PTU 1 and the PRU 3 may transmit and receive power in a magnetic resonance method. When the PTU 1 supplies power for wireless charging, the wireless communication device 2 configured to transmit low power may be unintentionally supplied with excessive power and thus cause the wireless communication device 2 to break. The protection apparatus 24 protects the wireless communication device 2 by blocking a power signal from being supplied to the wireless communication device 2 during wireless charging.

The PRU 3 and the wireless communication device 2 may be separated from each other or may be located in a single electronic device. When the PRU 3 and the wireless communication device 2 are separated from each other, the PRU 3 may be a portable terminal and the wireless communication device 2 may be a credit card. When the PRU 3 and the wireless communication device 2 are located in a single device, the PRU 3 and the wireless communication device 2 may be located in a portable terminal.

The wireless communication device 2 according to the embodiment may be a communication device that transmits and receives a wireless signal using a magnetic field, for example, a near field communication (hereinafter, referred to as NFC) device or a radio frequency identification (hereinafter, referred to as RFID) device. The NFC device performs near field communication in a frequency band of several to several tens of MHz, and for example, may transmit and receive a wireless signal in a frequency band of 13.56 MHz. As another example, the wireless communication device 2 may be a magnetic secure transmission (hereinafter, referred to as MST) device. The MST device is provided with an antenna or an inductive element that generates or reacts to a magnetic field.

The PTU 1 and the PRU 3 according to the embodiment operate according to a magnetic resonance scheme. For example, the PTU 1 and the PRU 3 transmit and receive power using an Alliance for Wireless Power (A4WP) scheme. According to the A4WP scheme, an A4WP PTU supplies a power signal to an A4WP PRU through magnetic resonance in a frequency band of 6.78 MHz. However, the wireless charging scheme according to the present invention is not limited to the A4WP scheme. When wireless charging is performed in a frequency band different from a frequency band of the wireless communication device 2 without operating according to the A4WP scheme, for example, even when wireless charging is performed at 4 MHz, the protection apparatus 24 may protect an NFC device using a frequency band of 13.56 MHz, or other wireless communication devices using a frequency band close to that of the NFC device.

The present invention may be applied to the protection of the wireless communication device 2 from a wireless charging device for transmitting and receiving a wireless power signal when a frequency band of the wireless charging device is relatively close to a frequency band of the wireless communication device 2. For example, the present invention is applied to the protection of an NFC device which uses a frequency band of 13.56 MHz from an A4WP wireless charging device which uses a frequency band of 6.78 MHz.

Referring to FIG. 1, the wireless communication device 2 according to the embodiment includes a resonator 20, a main body 22, and a protection apparatus 24. That is, a wireless communication device 2 according to another embodiment includes a resonator 20, a main body 22, and a protection apparatus 24 inside the main body 22, as shown in FIG. 2. That is, the protection apparatus 24 may be separated from the main body 22, as shown in FIG. 1, or may be integrated into the main body 22, as shown in FIG. 2.

The resonator 20 of the wireless communication device 2 may include an antenna or an inductive element that generates or reacts to a magnetic field. The main body 22 may be a rectifier that receives an output of the resonator 20 and rectifies the output. When the wireless communication device 2 is an NFC device, the main body may be an NFC chip. The protection apparatus 24 senses a power voltage VDD of a power terminal of the main body 22. When the power voltage VDD rises to a preset threshold or higher, the protection apparatus 24 externally confirms a wireless charging state and protects the main body 22 from a power signal for wireless charging.

To aid in the understanding of the present invention, embodiments for protecting the NFC device from the A4WP PTU will be described with reference to the following drawings, while limiting the wireless communication device 2 to the NFC device, limiting the PTU to an A4WP PTU, and limiting the PRU to an A4WP PRU. However, the present invention is not limited thereto.

Figure 3:
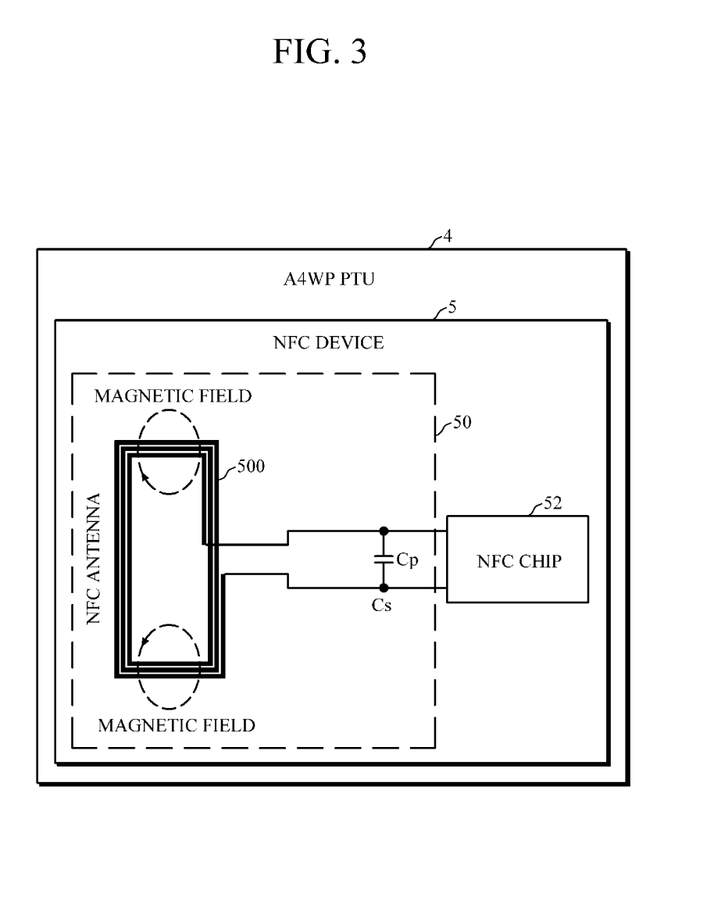
FIG. 3 is a circuit diagram illustrating a state in which a near field communication (NFC) device is located on an Alliance for Wireless Power (A4WP) power transmitting unit (PTU) that supplies power at a frequency of 6.78 MHz.

FIG. 3 is a circuit diagram illustrating a state in which a NFC device is located on an A4WP PTU that supplies power at a frequency of 6.78 MHz.

Referring to FIG. 3, an NFC device 5 includes a resonator 50 including an NFC antenna, capacitors Cs and Cp, and an NFC chip 52. Even when NFC is not used, the NFC antenna 500 of the NFC device 5 is exposed to a magnetic field supplied by an A4WP PTU 4 in a case when the NFC device 5 is located on the A4WP PTU 4. In view of the operating frequencies of NFC and A4WP, NFC uses an operating frequency two times higher than that of A4WP and thus the frequency bands are distinguished, but a considerable amount of power may be received by the NFC antenna 500.

When the A4WP PRU is mounted on a portable terminal such as a mobile phone, the A4WP antenna is usually located on a rear surface of the portable terminal because a display is located on a front surface of the portable terminal, and the NFC antenna 500 is also usually located on the rear surface of the portable terminal. Accordingly, even when NFC using the NFC antenna 500 is not used, the NFC antenna 500 is exposed to a magnetic field supplied by the A4WP PTU 4 during wireless charging, and thus a magnetic field is generated. Accordingly, a considerable amount of power signals may be received by the NFC antenna 500.

Figure 4:
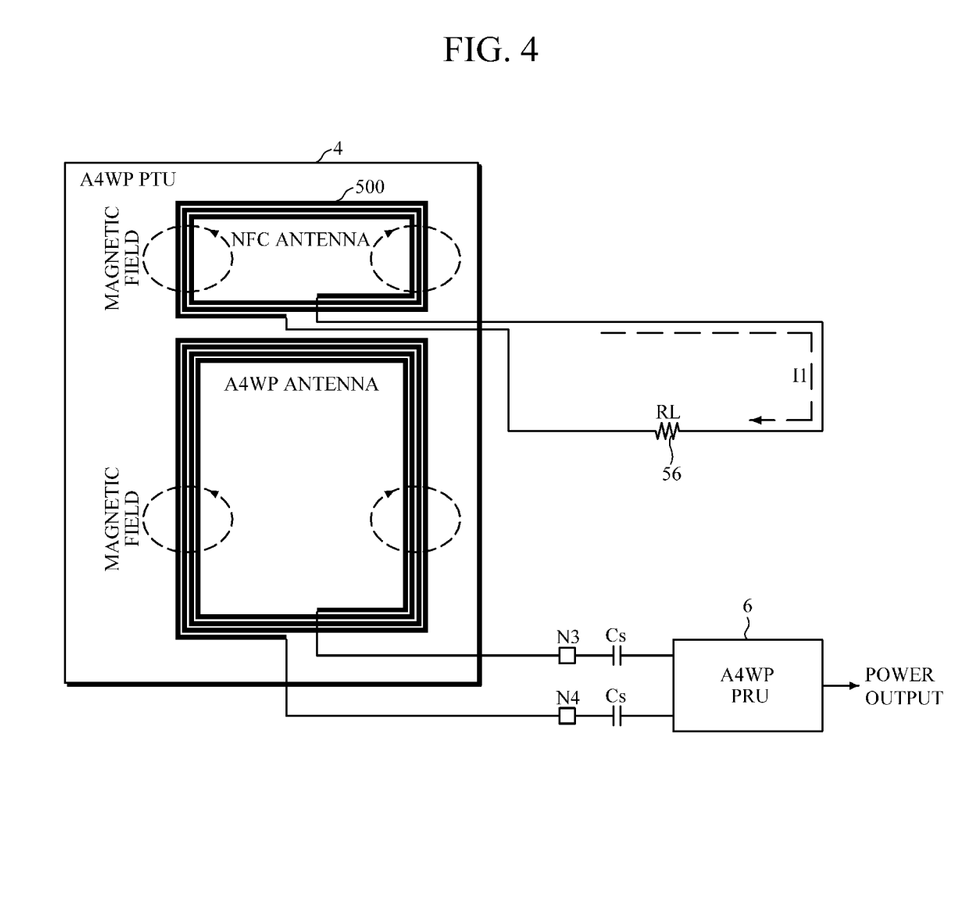
FIG. 4 is a circuit diagram for measuring power received by an NFC antenna.

FIG. 4 is a circuit diagram for measuring power received by an NFC antenna.

Referring to FIG. 4, it is assumed that, in order to measure received power of the NFC antenna 500 when the A4WP PTU 4 and the A4WP PRU 6 transmit and receive power therebetween, the NFC antenna 500 with a 10 Ω resistor RL 56 is connected to the A4WP PTU 4. In this case, the A4WP PRU 6 is in a state of receiving about 5 W of power from the A4WP PTU 4.

Figure 5:
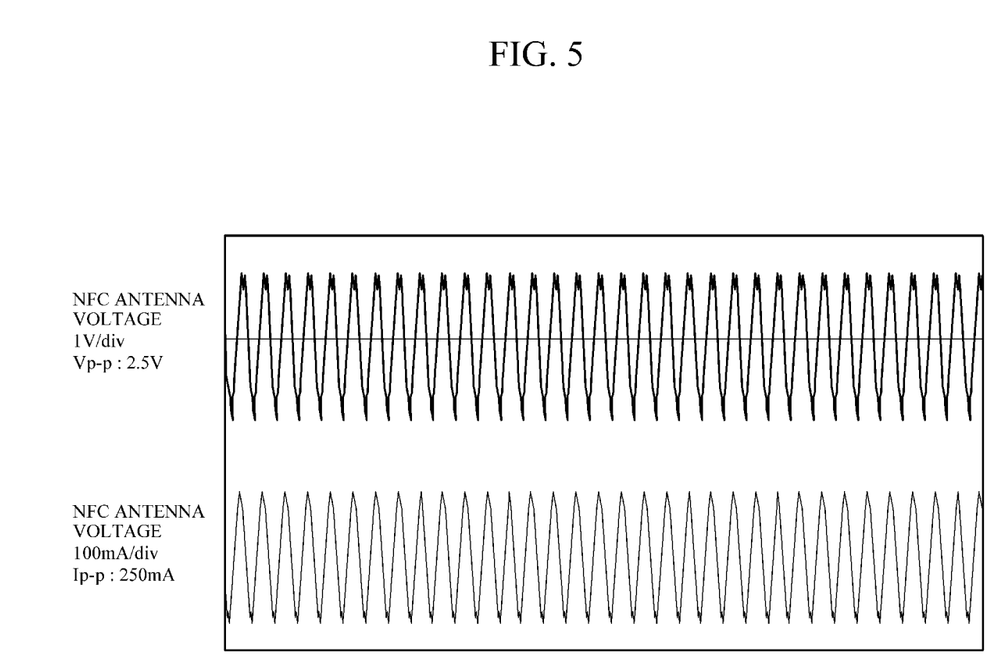
FIG. 5 is a waveform diagram illustrating a result of measuring a voltage and a current of an NFC antenna when power is measured as shown in FIG. 4.

FIG. 5 is a waveform diagram illustrating a result of measuring a voltage and a current of an NFC antenna when power is measured as shown in FIG. 4.

Referring to FIGS. 4 and 5, the NFC antenna 500 receives a voltage with about 2.5 Vpeak and a current with 250 mApeak. The voltage and current of the NFC antenna 500 are determined by a function affected by a distance and position of the NFC antenna 500 with respect to the A4WP PTU 4, but the voltage and current of the NFC antenna 500 placed in the middle of the A4WP PTU 4 without being separated upward therefrom are measured as shown in FIG. 5. The A4WP PTU 4 having a maximum output power of about 15 W is used, but transmission power of the A4WP PTU 4 is about 10 W under experimental conditions.

It can be seen from the experiment results that the NFC antenna 500 also receives 0.3 W of power. Such a level of power is not great for the A4WP PRU 6, but such a level of power is great enough to cause a problem in an NFC device.

Figure 6:
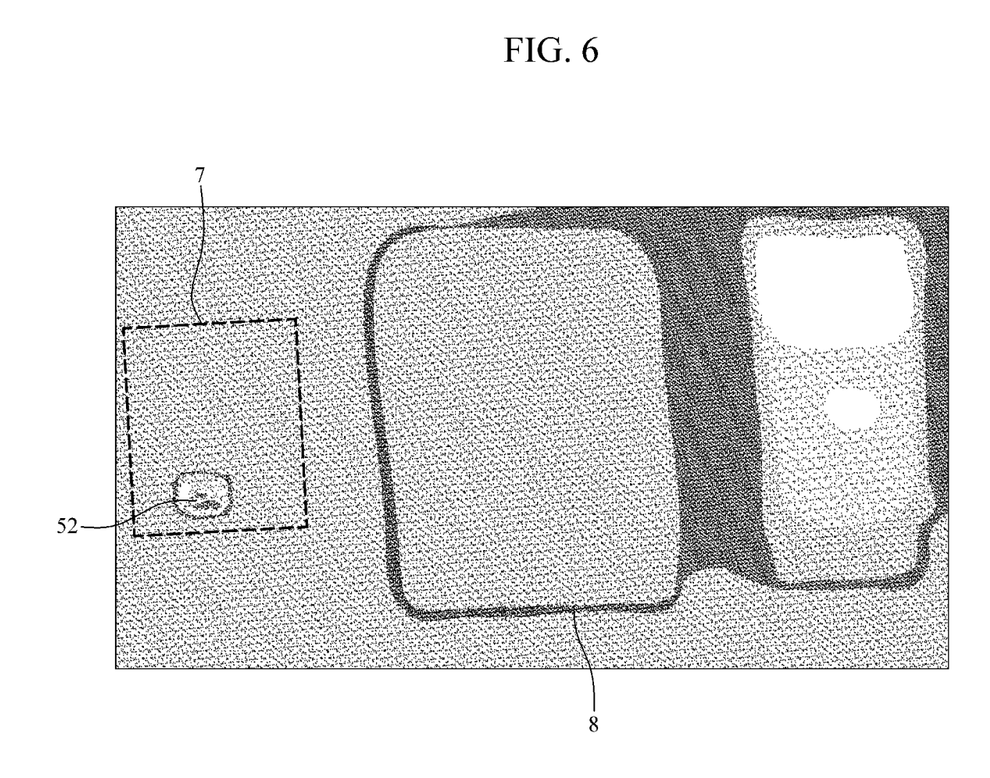
FIG. 6 is a reference diagram illustrating an image of a credit card equipped with an NFC chip and a mobile phone equipped with an A4WP PRU, which are placed on an A4WP PTU, captured by a thermal imaging camera.

FIG. 6 is a reference diagram illustrating an image of a credit card equipped with an NFC chip and a mobile phone equipped with an A4WP PRU, which are placed on an A4WP PTU, captured by a thermal imaging camera.

Referring to FIG. 6, when a credit card 7 equipped with the NFC chip 52 and a mobile phone 8 equipped with an A4WP PRU are placed on an A4WP PTU, it can be seen that the NFC chip 52 of the credit card 7 is overheated by receiving power. When the NFC chip 52 performing an NFC function remains in this state for a predetermined period of time, for example, 10 minutes, the NFC chip 52 is broken.

Figure 7:
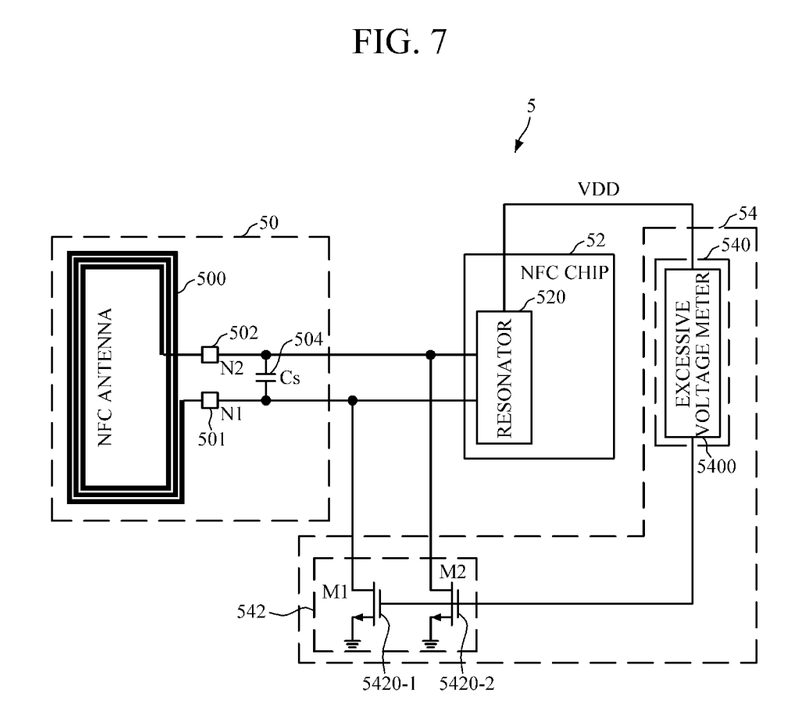
FIG. 7 is a block diagram illustrating an NFC device including a protection apparatus according to an embodiment of the present invention.

FIG. 7 is a block diagram illustrating an NFC device including a protection apparatus according to an embodiment of the present invention, Referring to FIG. 7, an NFC device 5 includes a resonator 50, an NFC chip 52, and a protection apparatus 54, wherein the NFC chip 52 includes a rectifier 520, and the protection apparatus 54 includes a determination unit 540 and a protection unit 542.

The NFC device 5 may be the wireless communication device 2 shown in FIGS. 1 and 2, the resonator 50 of the NFC device 5 may be the resonator 20 shown in FIGS. 1 and 2, the NFC chip 52 may be the main body shown in FIGS. 1 and 2, and the protection apparatus 54 may be the protection apparatus 24 shown in FIGS. 1 and 2.

Hereinafter, the configuration of the NFC device 5 will be described.

The resonator 50 of the NFC device 5 includes an NFC antenna 500 and a capacitor Cs 504. The NFC antenna 500 has an inductance component. The NFC chip 52 includes the rectifier 520, and the rectifier 520 rectifies an alternating current (AC) signal received from the resonator 50 into a direct current (DC) signal. The protection apparatus 54 includes the determination unit 540 and the protection unit 542. The determination unit 540 may include an excessive voltage meter 5400. The excessive voltage meter 5400 measures a power voltage VDD of a power terminal of the NFC chip 52, determines a wireless charging state when the power voltage VDD rises, and outputs a high-level control signal.

The protection unit 542 according to the embodiment includes a first switching element M1 5420-1 and a second switching element M2 5420-2. The first switching element M1 5420-1 has a first output to which a ground voltage is applied, a second output connected to a first antenna node 501, and an input to which a control signal output from the excessive voltage meter 5400 is transmitted such that the first switching element M1 5420-1 is turned on or off by the control signal. The second switching element M2 5420-2 has a third output to which a ground voltage is supplied, a fourth output connected to a second antenna node 502, and an input to which the control signal being output from the excessive voltage meter 5400 is supplied such that the second switching element M2 5420-2 is turned on or off by the control signal. Referring to FIG. 7, the protection apparatus 54 including the determination unit 540 and the protection unit 542 are illustrated as being separated from the NFC chip 52, but according to another embodiment, the protection apparatus 54 may be fabricated to be integrated into the NFC chip 52.

The A4WP PTU and the A4WP PRU transmit and receive a wireless power signal at a resonance frequency of 6.78 MHz through magnetic resonance, and the NFC device 5 performs wireless communication using a magnetic field at an operating frequency of 13.56 MHz. Since the frequency bands are very close to each other, the NFC antenna 500 is affected by a magnetic field generated by the A4WP PTU while the A4WP PTU is supplying a power signal, and thus a magnetic field is generated in the NFC antenna 500. In this case, the protection apparatus 54 blocks a power signal from being supplied to the NFC chip 52 by the magnetic field generated by the NFC antenna 500 to protect the NFC chip 52.

In detail, the determination unit 540 of the protection apparatus 54 determines whether the A4WP PTU is in a state of receiving a power signal from the A4WP PRU for wireless charging. To this end, the determination unit 540 uses the power voltage VDD of the power terminal of the NFC chip 52. For example, the determination unit 540 senses whether the power voltage VDD rises to a preset threshold voltage or higher and applies a high-level control signal to the protection unit 54 when the power voltage VDD rises to block a power signal from being supplied to the NFC chip 52. Accordingly, the NFC chip 52 is protected from wireless charging.

Hereinafter, a process of protecting the NFC chip 52 using the protection apparatus 54 will be described with reference to the circuit shown in FIG. 7.

When excessive energy is supplied from the A4WP PTU, the power voltage VDD of the NFC chip 52 is increased through the rectifier 520 that receives energy from the NFC antenna 500. Although the NFC chip 52 is generally equipped with a shunt regulator to prevent the power voltage VDD from being excessively increased, the rectifier 520 itself may be broken by the excessive energy. Accordingly, the excessive voltage meter 5200 of the determination unit 540 may, in response to sensing that the power voltage VDD of the power terminal of the NFC chip 52 is excessively increased, generate a high-level control signal to turn the switching elements M1 and M2 5420-1 and 5420-2 on. When the switching elements M1 and M2 5420-1 and 5420-2 are turned on, most of an antenna current flows through the switching elements M1 and M2 5420-1 and 5420-2 and thus the NFC chip 52 including the rectifier 520 is protected. When the antenna current is not supplied to the power voltage VDD due to the switching elements M1 and M2 5420-1 and 5420-2 being turned on, the power voltage VDD decreases, and in turn, the switching elements M1 and M2 5420-1 and 5420-2 are turned off. As the switching elements M1 and M2 5420-1 and 5420-2 are turned off, the power voltage VDD is increased again, and the above described operations are repeated to protect the NFC chip 52.

Figure 8:
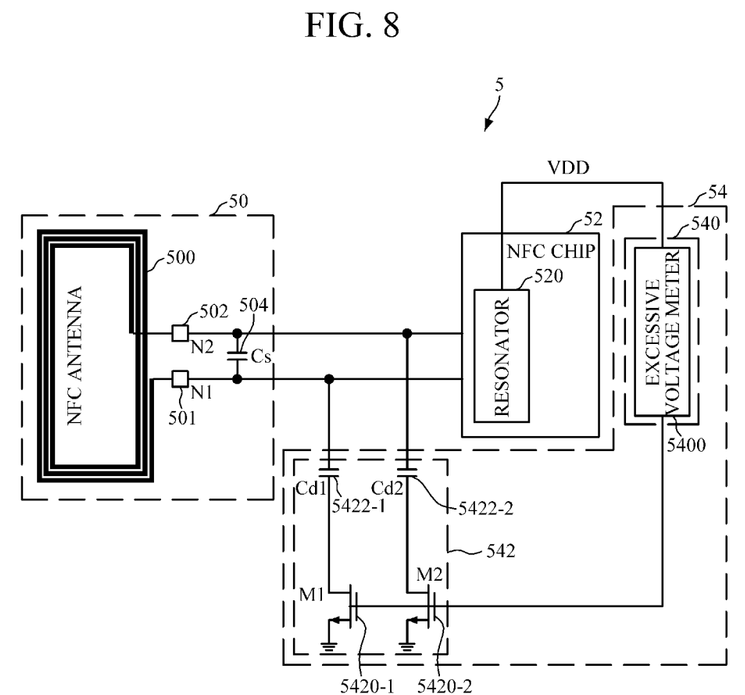
FIG. 8 is a block diagram illustrating an NFC device for describing a method of adjusting a current flowing through switching elements (M1, M2) when a protection operation is performed using capacitors.

FIG. 8 is a block diagram illustrating an NFC device for describing a method of adjusting a current flowing the switching elements M1 and M2 when a protection operation is performed using capacitors, When the NFC chip 52 is protected using the switching elements M1 and M2 5420-1 and 5420-2, an excessive current may be supplied from the NFC antenna 500 to the switching elements M1 and M2 5420-1 and 5420-2 in a case when a turn-on resistance of the switching elements M1 and M2 5420-1 and 5420-2 is small. Accordingly, a capacitor Cd1 5422-1 and a capacitor Cd2 5422-2 are connected in series to the switching elements M1 and M2 5420-1 and 5420-2, respectively, such that the resonance frequency of the resonator is changed. When a resonance frequency of the resonator 50 is decreased below the frequency input to the NFC antenna 500, the received current may be reduced.

Hereinafter, the configuration of the protection unit 542 is described. The protection unit 542 includes the switching elements M1 and M2 5420-1 and 5420-2 and the capacitors Cd1 and Cd2 5422-1 and 5422-2. The first switching element M1 5420-1 has a first output to which a ground voltage is applied, a second output connected to the capacitor Cd1 5422-1, and an input to which a control signal generated from the excessive voltage meter 5400 is transmitted such that the first switching element M1 5420-1 is turned on or off by the control signal. The second switching element M2 5420-2 has a third output to which a ground voltage is applied, a fourth output connected to the capacitor Cd2 5422-2, and an input to which a control signal generated from the excessive voltage meter 5400 is transmitted such that the second switching element M2 5420-2 is turned on/off by the control signal.

The first capacitor Cd1 5422-1 is formed between the first antenna node 501 and the first switching element M1 5420-1 and, by having a current path formed due to the first switching element M1 5420-1 being turned on, allows a resonance frequency of the resonator 50 to be shifted. The second capacitor Cd2 5422-2 is formed between the second antenna node 502 and the second switching element M2 5420-2 and, by having a current path formed due to the second switching element M2 5420-2 being turned on, allows a resonance frequency of the resonator 50 to be shifted.

Hereinafter, the operation of the protection apparatus 54 is described. When the power voltage VDD increases, the switching elements M1 and M2 5420-1 and 5420-2 are turned on by the control signal of the excessive voltage meter 5400, and the outputs of the switching elements M1 and M2 5420-1 and 5420-2, which are turned on, are connected to the capacitors Cd1 and Cd2 5422-1 and 5422-2, respectively, and the capacitors Cd1 and Cd2 5422-1 and 5422-2 are connected to the antenna nodes N1 and N2 501 and 502, respectively. When the switching elements M1 and M2 5420-1 and 5420-2 are turned on, current paths to the capacitors Cd1 and Cd2 5422-1 and 5422-2 are formed, the resonance frequency of the resonator 50 including the NFC antenna 500 and the capacitor Cs 504 is shifted so that the power signal being received by the NFC chip 52 is reduced and most of the current flows to the capacitors Cd1 and Cd2 5422-1 and 5422-2, and thus the NFC chip 52 is protected.

Figure 9:
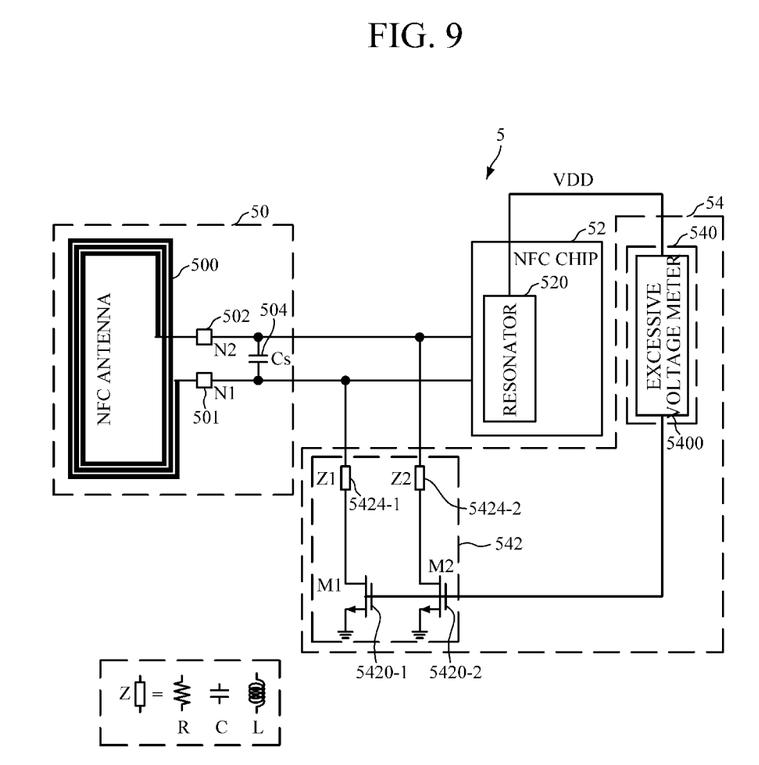
FIG. 9 is a block diagram illustrating an NFC device for describing a method of adjusting a current flowing switching elements (M1, M2) when a protection operation is performed using impedance elements.

FIG. 9 is a block diagram illustrating an NFC device for describing a method of adjusting a current flowing through the switching elements M1 and M2 when a protection operation is performed using impedance elements.

Referring to FIG. 9, the protection unit 542 includes impedance elements Z1 and Z2 (5424-1 and 5424-2). The impedance elements Z1 and Z2 (5424-1 and 5424-2) that limit a current may be one of a resistor R, an inductor L, and a capacitor C, or a combination thereof. Connecting resistors R may allow currents of the switching elements M1 and M2 5420-1 and 5420-2 to be reduced, but it may be difficult to secure the power voltage VDD when the received antenna current is high. Accordingly, there is need to properly adjust the resistor R. Connecting capacitors C is the same as described above with reference to FIG. 8, and thus descriptions thereof will be omitted. Connecting inductors L also corresponds to a method of reducing received energy by changing the resonance frequency of the resonator 50.

Figure 10:
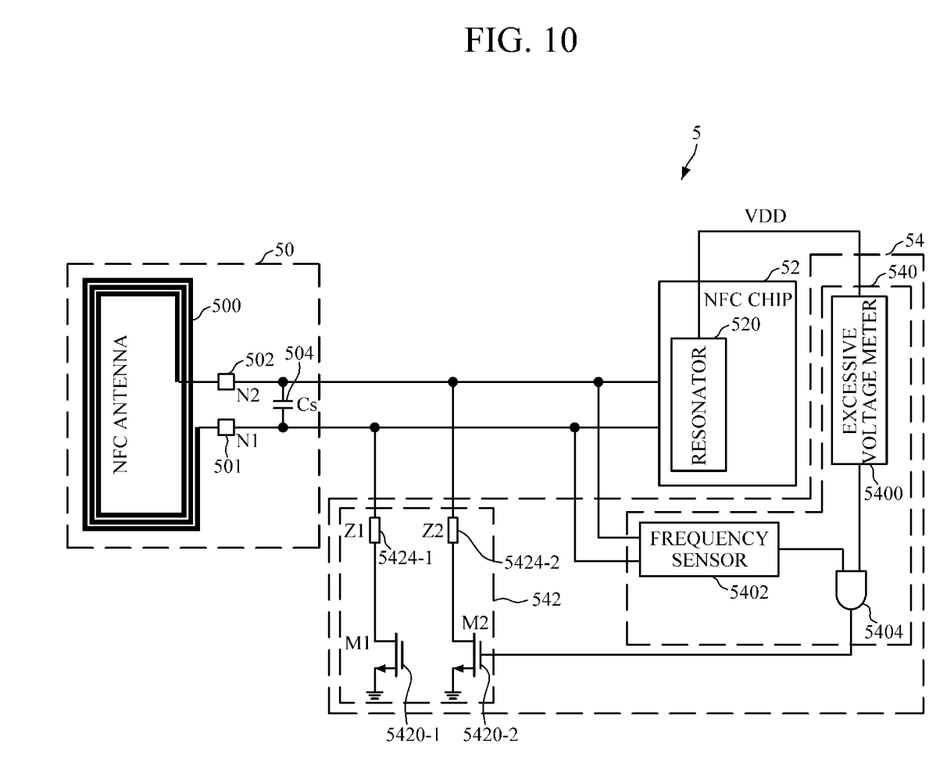
FIG. 10 is a block diagram illustrating an NFC device for describing a protection method when a specific frequency is sensed and a power voltage (VDD) of an NFC chip is high.

FIG. 10 is a block diagram illustrating an NFC device for describing a protection method when a specific frequency is sensed and a power voltage VDD of an NFC chip is high.

There is a case in which protection is needed only when a power voltage is increased by a specific frequency component. In this case, it is determined whether a specific frequency is applied using a frequency sensor 5402 that senses a frequency from an input signal of the NFC rectifier, it is determined whether the power voltage VDD is high using the excessive voltage meter 5400, and the switching elements M1 and M2 (5420-1 and 5420-2) are turned on to secure the power voltage VDD.

Referring to FIG. 10, the determination unit 540 includes an excessive voltage meter 5400, a frequency sensor 5402, and an AND circuit 5404. The excessive voltage meter 5400 measures the power voltage VDD of the NFC chip 52, determines a wireless charging state when the power voltage VDD rises, and outputs a high-level control signal. The frequency sensor 5402 senses the frequency of an input signal of the rectifier, confirms a wireless charging state when the sensed frequency is a resonance frequency for wireless charging, and outputs a high-level control signal. The AND circuit 5404 receives the control signal of the excessive voltage meter 5400 and the control signal of the frequency sensor 5402, performs a logic product on the received control signals, and transmits a control signal for controlling the protection unit 542 to the protection unit 542. The protection unit 542 includes the first switching element M1 5420-1, the second switching element M2 5420-2, and the impedance elements Z1 and Z2 (5424-1 and 5424-2).

The circuit shown in FIG. 10 may be implemented with various methods. The switching elements M1 and M2 (5420-1 and 5420-2), the excessive voltage meter 5400, the frequency sensor 5402, and the like may be integrated inside the NFC chip 52, or may be implemented as external circuits of the NFC chip 52.

The above description has been made in relation to the NFC device 5 as an example with reference to the drawings, but it may be applied to other wireless communication devices capable of transmitting a signal using an antenna or an inductive element, for example, an MST device, to prevent the wireless communication device from being broken due to energy excessively supplied by an external magnetic field.

The above description of the present invention is made in relation to the embodiments. A person having ordinary skilled in the art should appreciate that other specific modifications may be easily made without departing from the technical spirit or essential features of the present invention. Therefore, the above embodiments should be regarded as illustrative rather than limitative in all aspects. The scope of The invention is not to be limited by the detailed description set forth above, but by the accompanying claims of the present invention, and it should also be understood that all changes or modifications derived from the definitions and scope of the claims and their equivalents fall within the scope of the present invention.

The invention claimed is:

1. An apparatus for protecting a wireless communication device, the apparatus comprising:
 a determination unit configured to sense a power voltage of a wireless communication device that transmits and receives a signal in a wireless manner by generating or reacting to a magnetic field and configured to externally confirm a wireless charging state in response to sensing the power voltage rising to a preset threshold voltage or higher; and
 a protection unit configured to protect the wireless communication device from a power signal for wireless charging when the wireless charging state is confirmed by the determination unit.

2. The apparatus of claim 1, wherein the determination unit comprises an excessive voltage meter configured to measure a power voltage of a main body of the wireless communication device, determine the wireless charging state when the power voltage rises, and transmit a high-level control signal for controlling the protection unit to the protection unit.

3. The apparatus of claim 1, wherein the determination unit comprises a frequency sensor configured to sense a frequency of an input signal of a rectifier inside a main body of the wireless communication device, confirms a wireless charging state when the sensed frequency is a resonance frequency for wireless charging, and apply a high-level control signal for controlling the protection unit to the protection unit.

4. The apparatus of claim 1, wherein the determination unit comprises:
 an excessive voltage meter configured to measure a power voltage of a main body of the wireless communication device, determine a wireless charging state when the power voltage rises, and output a high-level control signal;
 a frequency sensor configured to sense a frequency of an input signal of a rectifier inside the main body of the wireless communication device, confirms a wireless charging state when the sensed frequency is a resonance frequency for wireless charging, and output a high-level control signal; and
 an AND circuit configured to receive the high-level control signals of the excessive voltage meter and the frequency sensor, perform a logic product on the received high-level control signals, and transmit a control signal for controlling the protection unit to the protection unit.

5. The apparatus of claim 1, wherein the protection unit comprises a switching element configured to receive a control signal from the determination unit, and with the switching element being turned on by the control signal of the determination unit in response to the power voltage rising, allow an antenna current to flow through the switching element such that the wireless communication device is protected from wireless power.

6. The apparatus of claim 1, wherein the protection unit comprises a switching element configured to receive a control signal from the determination unit, wherein, by repeating an operation in which the switching element is turned on by the control signal to prevent an antenna current from being applied to the power voltage so as to reduce the power voltage, the switching element is turned off, and as the switch element is turned off, the power voltage rises again to protect the wireless communication device.

7. The apparatus of claim 1, wherein the protection unit comprises:
 a first switching element having a first output to which a ground voltage is applied, a second output connected to a first antenna node, and an input to which a control signal generated from an excessive voltage meter is transmitted such that the first switching element is turned on or off by the control signal; and
 a second switching element having a third output to which a ground voltage is applied, a fourth output connected to a second antenna node, and an input to which the control signal generated from the excessive voltage meter is transmitted such that the second switching element is turned on or off by the control signal.

8. The apparatus of claim 1, wherein the protection unit comprises:
 a first switching element having a first output to which a ground voltage is applied, a second output connected to a first impedance element, and an input to which a control signal generated from an excessive meter is transmitted such that the first switching element is turned on or off by the control signal;
 a second switching element having a third output to which a ground voltage is applied, a fourth output connected to a second impedance element, and an input to which the control signal generated from the excessive meter is transmitted such that the second switching element is turned on or off by the control signal;
 the first impedance element formed between a first antenna node and the first switching element, and by having a current path formed due to the first switching element being turned on, allowing a resonance frequency of a resonance circuit to be shifted; and
 the second impedance element formed between a second antenna node and the second switching element, and by having a current path formed due to the second switching element being turned on, allowing a resonance frequency of the resonance circuit to be shifted.

9. The apparatus of claim 8, wherein each of the first and second impedance elements is one of a resistor, an inductor, and a capacitor or a combination thereof.

10. The apparatus of claim 1, wherein the wireless communication device is a near field communication (NFC) device.

11. The apparatus of claim 1, wherein the wireless communication device is a magnetic secure transmission (MST) device.

12. A wireless communication device comprising:
 a resonator including an antenna or an inductive element that generates or reacts to a magnetic field;
 a main body including a rectifier configured to receive an output of a resonator and rectify the received output; and
 a protection apparatus configured to sense a power voltage of the main body, externally confirm a wireless charging state when the power voltage rises to a preset threshold voltage or higher, and protect the wireless communication device from a power signal for wireless charging.

13. A wireless communication device comprising:
 a resonator including an antenna or an inductive element that generates or reacts to a magnetic field; and a main body including a rectifier configured to receive an output of the resonator and rectify the received output, and a protection apparatus configured to sense a power voltage of the main body, externally confirm a wireless charging state when the power voltage rises to a preset threshold voltage or higher, and protect the wireless communication device from a power signal for wireless charging.

14. A portable terminal comprising:

a power receiver antenna;

a wireless communication antenna;

a power receiving unit configured to receive a wireless power signal from a power transmitting unit through magnetic resonance of the power receiver antenna;

a wireless communication main body configured to perform wireless communication using a magnetic field of the wireless communication antenna; and a protection apparatus configured to sense a power voltage of the wireless communication main body, determine that the power receiving unit is in a wireless charging state in response to sensing the power voltage rising to a preset threshold voltage or higher, and protect the wireless communication main body from a power signal for wireless charging.

* * * * *